United States Patent
Houng et al.

(10) Patent No.: US 7,714,764 B2
(45) Date of Patent: May 11, 2010

(54) ANALOG TO DIGITAL CONVERTER WHICH USES TUNNELING MAGNETO-RESISTIVE DEVICES

(75) Inventors: Young-Tack Houng, Suwon-si (KR); Sang-Wook Kwon, Seongnam-si (KR); In-Sang Song, Seoul (KR); Seung Seob Lee, Daejeon (KR); Kangwon Lee, Daejeon (KR); Seok Woo Lee, Gongju-si (KR); Phillip Lee, Seoul (KR)

(73) Assignees: Samsung Electronics Co., Ltd., Suwon-si (KR); Korea Advanced Institute of Science and Technology, Daejeon (KR)

( * ) Notice: Subject to any disclaimer, the term of this patent is extended or adjusted under 35 U.S.C. 154(b) by 55 days.

(21) Appl. No.: 12/048,563

(22) Filed: Mar. 14, 2008

(65) Prior Publication Data
US 2009/0096655 A1    Apr. 16, 2009

(30) Foreign Application Priority Data
Oct. 10, 2007    (KR) .................. 10-2007-0102002

(51) Int. Cl.
*H03M 1/12* (2006.01)
(52) U.S. Cl. .................. 341/171; 341/155; 341/172; 365/158; 365/171; 365/173

(58) Field of Classification Search .................. 341/108, 341/138, 155, 156, 158, 171; 365/158, 171, 365/173
See application file for complete search history.

(56) References Cited

U.S. PATENT DOCUMENTS

| | | | | |
|---|---|---|---|---|
| 3,803,591 | A * | 4/1974 | Watanabe et al. | 341/171 |
| 5,291,198 | A * | 3/1994 | Dingwall et al. | 341/159 |
| 5,894,447 | A * | 4/1999 | Takashima | 365/158 |
| 6,169,689 | B1 * | 1/2001 | Naji | 365/173 |
| 6,498,577 | B1 * | 12/2002 | Lin | 341/156 |
| 6,542,107 | B1 * | 4/2003 | Galambos et al. | 341/172 |
| 6,754,098 | B2 * | 6/2004 | Kunikiyo | 365/158 |
| 6,795,340 | B2 * | 9/2004 | Sakimura et al. | 365/171 |
| 6,944,048 | B2 * | 9/2005 | Iwata | 365/158 |
| 7,504,975 | B2 * | 3/2009 | Meagher | 341/142 |
| 2008/0278994 | A1 * | 11/2008 | Katti | 365/158 |

* cited by examiner

*Primary Examiner*—Linh V Nguyen
(74) *Attorney, Agent, or Firm*—DLA Piper LLP US

(57) ABSTRACT

An A/D converter is provided. The A/D converter determines a digital output value according to the resistance of the TMR device, resistance of which changes according to the magnetic field generated by at least one electrode into which current flows according to an analog input signal. Accordingly, an A/D converter to implement high resolution and high speed with low power consumption can be provided.

14 Claims, 7 Drawing Sheets

| DECIMAL NUMERAL | 0 | 1 | 2 | 3 | 4 | 5 | 6 | 7 |
|---|---|---|---|---|---|---|---|---|
| THERMOMETER CODE | 0 | 0 | 0 | 0 | 0 | 0 | 0 | 1 |
|  | 0 | 0 | 0 | 0 | 0 | 0 | 1 | 1 |
|  | 0 | 0 | 0 | 0 | 0 | 1 | 1 | 1 |
|  | 0 | 0 | 0 | 0 | 1 | 1 | 1 | 1 |
|  | 0 | 0 | 0 | 1 | 1 | 1 | 1 | 1 |
|  | 0 | 0 | 1 | 1 | 1 | 1 | 1 | 1 |
|  | 0 | 1 | 1 | 1 | 1 | 1 | 1 | 1 |
| DIGITAL OUTPUT VALUE (3 BITS) | 0 | 0 | 0 | 0 | 1 | 1 | 1 | 1 |
|  | 0 | 0 | 1 | 1 | 0 | 0 | 1 | 1 |
|  | 0 | 1 | 0 | 1 | 0 | 1 | 0 | 1 |

FIG. 8

ANALOG TO DIGITAL CONVERTER WHICH USES TUNNELING MAGNETO-RESISTIVE DEVICES

CROSS-REFERENCE TO RELATED APPLICATIONS

This application claims the benefit under 35 U.S.C. §119(a) of Korean Patent Application No. 10-2007-102002, filed Oct. 10, 2007, in the Korean Intellectual Property Office, the entire disclosures of both of which are hereby incorporated by reference.

BACKGROUND OF THE INVENTION

1. Field of the Invention

The present invention relates to an analog to digital (A/D) converter. More particularly, the present invention relates to an A/D converter of a parallel type which converts analog signals to digital signals using Micro Electro-Mechanical System (MEMS) technology.

2. Description of the Related Art

Diverse signals in nature change to analog continuously over time. In order to understand such a phenomenon in nature, the size of the analog signals need to be measured over time. The values are processed and analyzed using a computer, but in order for the computer to process and analyze analog signals, a device for converting the analog signals into digital values which are able to be processed in the computer is required. Such a device is an analog to digital (A/D) converter.

An A/D converter may be fabricated using Micro Electro-Mechanical System (MEMS) technology. MEMS technology may also be referred to as micro systems, micromachines, or micro mechatronics, and means developing mechanical devices with microscopic precision machinery technology. The A/D converter can be miniaturized using MEMS technology.

A/D converters include parallel comparator, single-slope, dual-slope, and successive approximation type A/D converters, among which an A/D converter of parallel comparator type uses an operational (OP) amplifier as a comparator, and encodes an output signal of the comparator to output a digital value in binary code. The comparator outputs a voltage corresponding to logical value 1 if an input voltage is higher than a reference voltage.

Such an A/D converter of parallel comparator type consists of a plurality of resistors to set a reference voltage, a plurality of comparators to compare voltages to each reference voltage, and an encoder to output digital signals.

However, the plurality of resistors and comparators have high power consumption. In addition, more resistors and comparators are required in order to implement higher resolution and higher speed, resulting in higher power consumption. In particular, an n-bit A/D converter requires a $2^n$ number of resistors and a $2^{n-1}$ number of comparators, so power consumption of an A/D converter of a larger number of bits increases exponentially.

Therefore, there is a need for an A/D converter having high resolution and high speed, but low power consumption.

SUMMARY OF THE INVENTION

The present invention aims to solve the above problems by providing an analog to digital (A/D) converter which determines digital output values according to the resistance of tunneling magneto-resistive (TMR) devices so as to provide high resolution and high speed with low power consumption.

In order to achieve the above object, an analog to digital (A/D) converter according to an exemplary embodiment of the invention may comprise at least one electrode into which current flows according to an analog input signal; at least one tunneling magneto-resistive (TMR) device which is arranged together with each electrode, and resistance of which changes according to a magnetic field generated by the current; and a digital signal generation unit which determines a digital output value according to the resistance of the TMR device.

The digital signal generation unit may comprise at least one resistance comparator which compares the resistance of the TMR device with a reference resistance; and an encoder which converts a thermometer code output from the resistance comparator into a binary code.

The A/D converter may further comprise a reference resistance unit which provides the reference resistance, wherein the resistance comparator compares the resistance of the TMR device with the reference resistance.

The resistance comparator may output a signal having a thermometer code value 1 if the resistance of the TMR device is higher than the reference resistance, and the resistance comparator may output a signal having a thermometer code value 0 if the resistance of the TMR device is lower than the reference resistance.

The at least one electrode may vary in thickness, and wherein the resistance of the TMR device is determined according to the thickness of the electrode.

The at least one electrode may increase thickness sequentially from a lowest bit to a highest bit.

Each TMR device may comprise a free layer which varies in thickness, wherein the magnetization direction of the free layer changes according to an external current, and wherein the resistance of the TMR device is determined according to the thickness of the free layer.

The free layer may increase in thickness sequentially from the lowest bit to the highest bit.

The A/D converter may comprise a $2^n-1$ number of electrodes if the A/D converter is an n-bit converter.

The A/D converter may comprise a $2^n-1$ number of TMR devices if the A/D converter is an n-bit converter.

BRIEF DESCRIPTION OF THE DRAWINGS

The above and other objects, features and advantages of certain exemplary embodiments of the present invention will be more apparent from the following description taken in conjunction with the accompanying drawing, in which.

Throughout the drawings, the same drawing reference numerals will be understood to refer to the same elements, features and structures.

DETAILED DESCRIPTION OF EXEMPLARY EMBODIMENTS

The matters defined in the description such as a detailed construction and elements are provided to assist in a comprehensive understanding of exemplary embodiments of the invention. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

Figure 1:
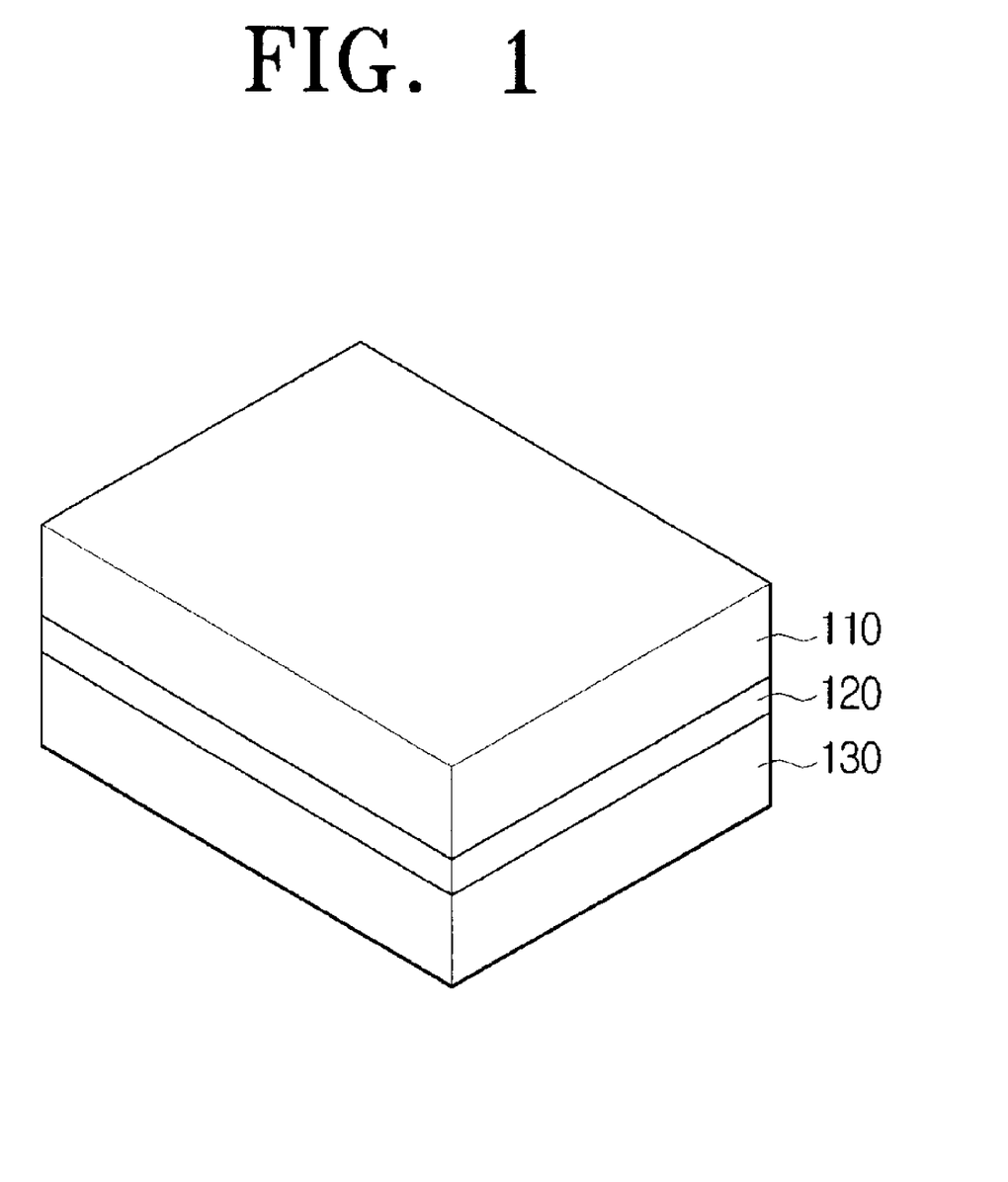
FIG. 1 is a perspective view illustrating a TMR device according to an exemplary embodiment of the present invention.

FIG. 1 is a perspective view illustrating a TMR device according to an exemplary embodiment of the present invention. The TMR device includes a pinned layer 110, an insulation layer 120, and a free layer 130, and the insulation layer 120 is disposed between the pinned layer 110 and the free layer 130.

The pinned layer 110 is formed of a ferromagnetic material which becomes magnetized in the magnetization direction of an external magnetic field, and remains magnetized after the material is no longer in the field. Even if the ferromagnetic material constituting the pinned layer 110 is in an external magnetic field having direction opposite the magnetization direction, the magnetization direction is not changed.

The insulation layer 120 is formed of a dielectric material, and is not magnetized in its natural state.

The free layer 130 is formed of a ferromagnetic material, but can control the magnetization direction. Accordingly, when the ferromagnetic material constituting the free layer 130 is in an external magnetic field having direction opposite the magnetization direction, the magnetization direction is changed.

Therefore, the TMR device has two states. In one state (referred to hereinbelow as a parallel state), the magnetization direction of the pinned layer 110 is identical to that of the free layer 130, and in the other state (referred to hereinbelow as an anti-parallel state), the magnetization direction of the pinned layer 110 is opposite that of the free layer 130. That is, the magnetization direction can be given values 0 and 1 using the parallel state and the anti-parallel state.

Figure 2A:
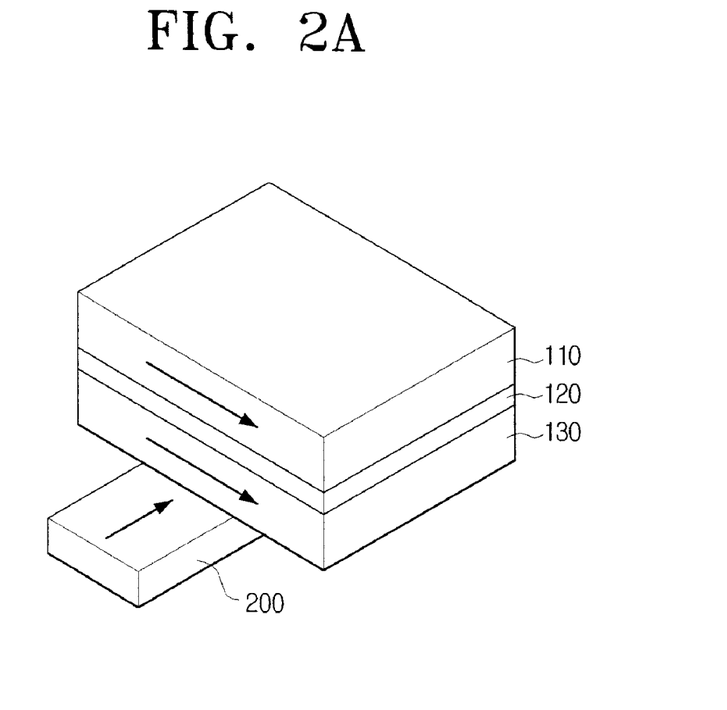
FIGS. 2A and 2B show the magnetization direction of a TMR device according to the current direction of an electrode according to an exemplary embodiment of the present invention.
Figure 2B:
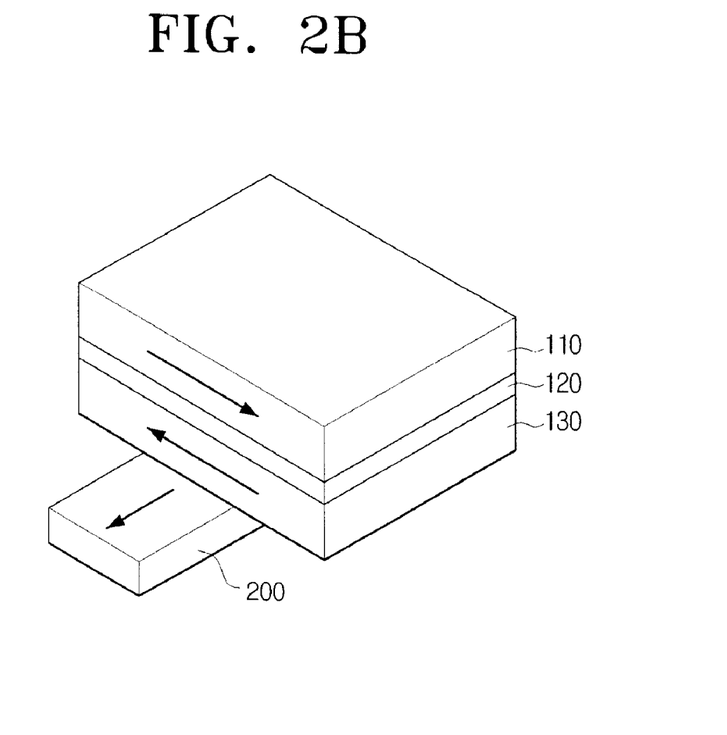

A method for changing the magnetization direction of the free layer 130 is given below. FIGS. 2A and 2B show the magnetization direction of a TMR device according to the current direction of an electrode according to an exemplary embodiment of the present invention.

The magnetization direction of the free layer 130 changes according to an external magnetic field. If a current flows in a conducting wire, a magnetic field is generated around the conducting wire. The external magnetic field can be added to the free layer 130 by making the current flow into the electrode 200.

As shown in FIG. 2A, if the current flows into the electrode 200 towards the free layer 130, the free layer 130 becomes magnetized to the right according to Fleming's right hand rule and remains magnetized to the right.

As shown in FIG. 2B, if the current flows into the electrode 200 away from the free layer 130, the free layer 130 becomes magnetized to the left. Therefore, if the magnetic force becomes greater than the coercivity of the free layer 130, the free layer 130 is changed to be magnetized to the left. The coercivity is the intensity of an external magnetic field required to change the magnetization direction of a ferromagnetic material.

Figure 3:
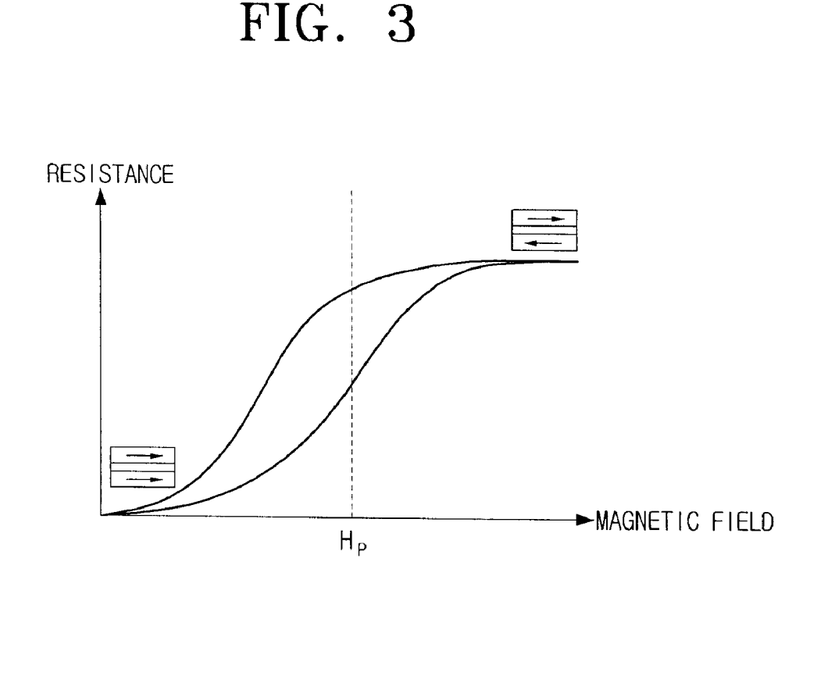
FIG. 3 is a graph illustrating change of the resistance of a TMR device according to an exemplary embodiment of the present invention.

As shown in FIG. 3B, the magnetization direction of the free layer 130 can be changed in an external magnetic field having a direction opposite the magnetization direction of the free layer 130.

The resistance of a TMR device is described below with reference to FIG. 3, which is a graph illustrating the change of resistance of a TMR device according to an exemplary embodiment of the present invention.

In FIG. 3, the x-axis represents the intensity of the external magnetic field, and the y-axis represents the resistance. In the graph, when the external magnetic field is weak, the TMR device is in a parallel state and the resistance is low, and when the external magnetic field is strong, the TMR device is in an anti-parallel state and the resistance is high, since the magnetization direction of the free layer 130 is inverse.

In the graph, $H_p$ denotes the coercivity of the magnetic field. That is, if the external magnetic field is higher than the coercivity, the magnetization direction of the free layer 130 is inverse. The resistance of the TMR device dramatically changes according to the coercivity.

The resistance of the TMR device can be given values 0 and 1.

A method for adjusting the magnetization direction of the free layer 130 using the magnetic field of the electrode is given below with reference to FIG. 4, which illustrates change of the magnetization direction of a TMR device according to a magnetic field around an electrode according to an exemplary embodiment of the present invention.

Figure 4:
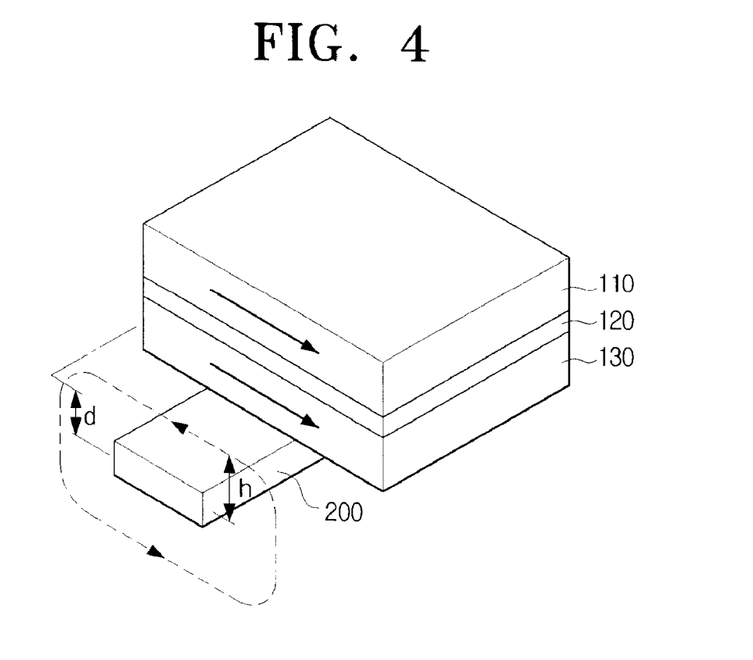
FIG. 4 illustrates change of the magnetization direction of a TMR device according to a magnetic field around an electrode according to an exemplary embodiment of the present invention.

As shown in FIG. 4, the center of the free layer 130 is spaced apart from the center of the electrode 200 at a distance of d. The line of the magnetic field is spaced apart from the center of the electrode 200 at a distance of h. The direction of the magnetic field is counterclockwise since the current flows into the electrode 200 in the direction opposite the free layer 130. Accordingly, the direction of the magnetic field of the electrode 200 is opposite the magnetization direction of the free layer 130.

The magnetic field increases in strength near the electrode 200, so the reference of the line of the magnetic field is the distance whereat the intensity of the magnetic field is identical to the coercity. Therefore, the magnetic field closer to the electrode 200 than the distance of h is higher than the coercity of the field, and the magnetic field further to the electrode 200 than the distance of h is lower than the coercity of the field. That is, if the distance between the free layer 130 and the electrode 200 is higher than h (d>h), the magnetization direction of the free layer 130 remains the same. However, if the distance between the free layer 130 and the electrode 200 is lower than h (d<h), the magnetization direction of the free layer 130 is reversed.

The magnetic field around the electrode 200 is proportional to the current flowing into the electrode 200. The higher the current of the electrode 200, the stronger the intensity of the magnetic field. In addition, the current of the electrode 200 is in inverse proportion to the input voltage. As a result, the input voltage is proportional to the intensity of the magnetic field. Accordingly, the intensity of the magnetic field can be adjusted according to the intensity of the input voltage. That is, as the value of h changes according to the intensity of the input voltage, a thermometer code can be acquired by adjusting the distance d between the free layer 130 and the electrode 200 for each bit.

Analog signals can be converted into digital signals through the TMR device based on the above properties.

Figure 5:
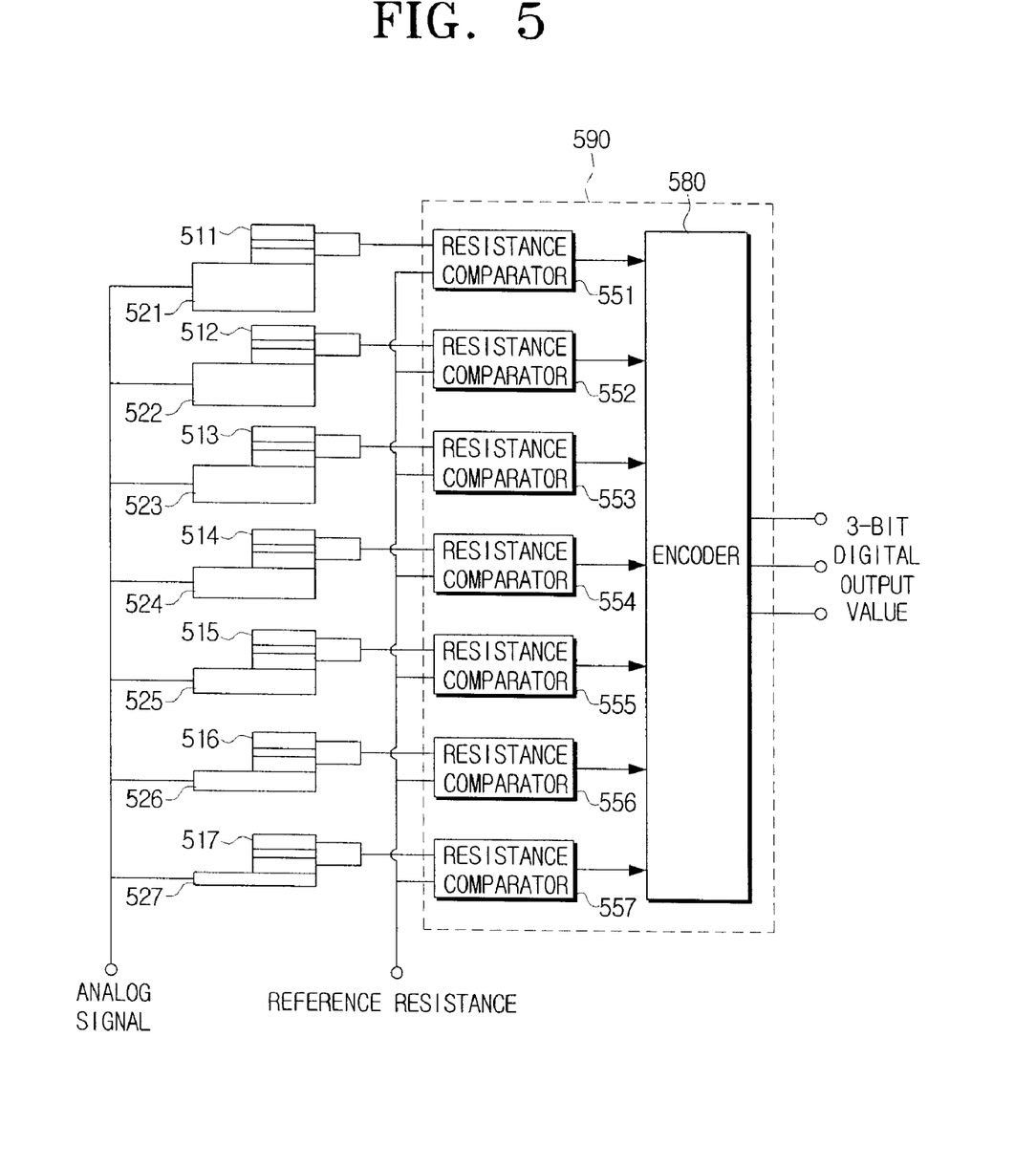
FIG. 5 is a diagram illustrating the structure of a 3-bit A/D converter having increasingly thin electrodes according to an exemplary embodiment of the present invention.

An A/D converter using TMR devices is described below with reference to FIGS. 5 to 8. FIG. 5 is a diagram illustrating the structure of a 3-bit A/D converter having increasingly thin electrodes according to an exemplary embodiment of the present invention.

As shown in FIG. 5, the 3-bit A/D converter according to an exemplary embodiment of the present invention includes seven TMR devices 511 to 517, seven electrodes 521 to 527, and a digital signal generation unit 590, and the digital signal generation unit 590 includes seven resistance comparators 551 to 557, and an encoder 580.

An A/D converter of n bits requires a $2^n-1$ number of TMR devices, electrodes, and resistance comparators respectively.

Each of the TMR devices 511 to 517 includes a pinned layer, an insulation layer, and a free layer. The resistance of each TMR device changes according to the magnetic field applied to the free layer. When each TMR device is in a parallel state in which the magnetization direction of the pinned layer is identical to that of the free layer, the resistance of the TMR device is low. When each TMR device is in an anti-parallel state in which the magnetization direction of the pinned layer is opposite that of the free layer, the resistance of the TMR device is high.

Analog signals are applied to the electrodes 521 to 527 in voltage form, so the current flows into the electrodes 521 to 527. The intensity of the current is proportional to the intensity of the applied analog signal.

The current flowing into the electrodes 521 to 527 generates magnetic fields around the electrodes 521 to 527. The magnetic fields change the magnetization directions of the free layers of the TMR devices 521 to 527.

The resistance comparators 551 and 557 compare the resistances of the TMR devices 511 to 517 with the reference resistance. If the resistance of TMR device is higher than the reference resistance, the resistance comparator outputs a signal having a thermometer code value of 1. If the resistance of TMR device is lower than the reference resistance, the resistance comparator outputs a signal having a thermometer code value of 0.

The thermometer code value is a code value which expresses a value by sequentially becoming 1 from the lowest bit. That is, 0000001 represents a decimal numeral 1 and 0000011 represents a decimal numeral 2. As a value is expressed by sequentially changing to 1 from the lowest bit, a thermometer code value having a number of M ciphers has an M+1 number of patterns. For example, with reference to FIG. 7, a thermometer code value having seven ciphers can express a total of eight decimal numerals from 0 to 7.

The encoder 580 converts a thermometer code output from the resistance comparators 551 to 557 into a binary code. In this exemplary embodiment, the A/D converter outputs a digital value of 3 bits.

The thickness of the electrodes 521 to 527 decreases from the highest bit to the lowest bit. The thinner the electrode, the shorter the distance d between the electrode and the free layer. Accordingly, although the same level of voltage is applied to the electrodes 521 to 527, the intensity of the magnetic field of a lower bit applied to the free layer is stronger than that of a higher bit applied to the free layer. Consequently, the TMR devices 511 to 517 sequentially change from a parallel state to an anti-parallel state from the lowest bit. Therefore, the resistance comparators 551 to 557 output signals having a thermometer code value of 1 sequentially from the lowest bit.

As the analog signal value increases, the number of TMR devices changing to an anti-parallel state increases and thus the number of resistance comparators outputting a signal having a thermometer code value of 1 increases. That is, as an analog signal value is higher, a thermometer code value is also higher, so an analog signal can be converted into a digital signal.

As described above, a 3-bit A/D converter can be implemented by adjusting the thickness of the electrodes 521 to 527.

An A/D converter implemented by adjusting the thickness of free layers of TMR devices is described with reference to FIG. 6, which is a diagram illustrating the structure of a 3-bit A/D converter having increasingly thin free layers according to another exemplary embodiment of the present invention.

Figure 6:
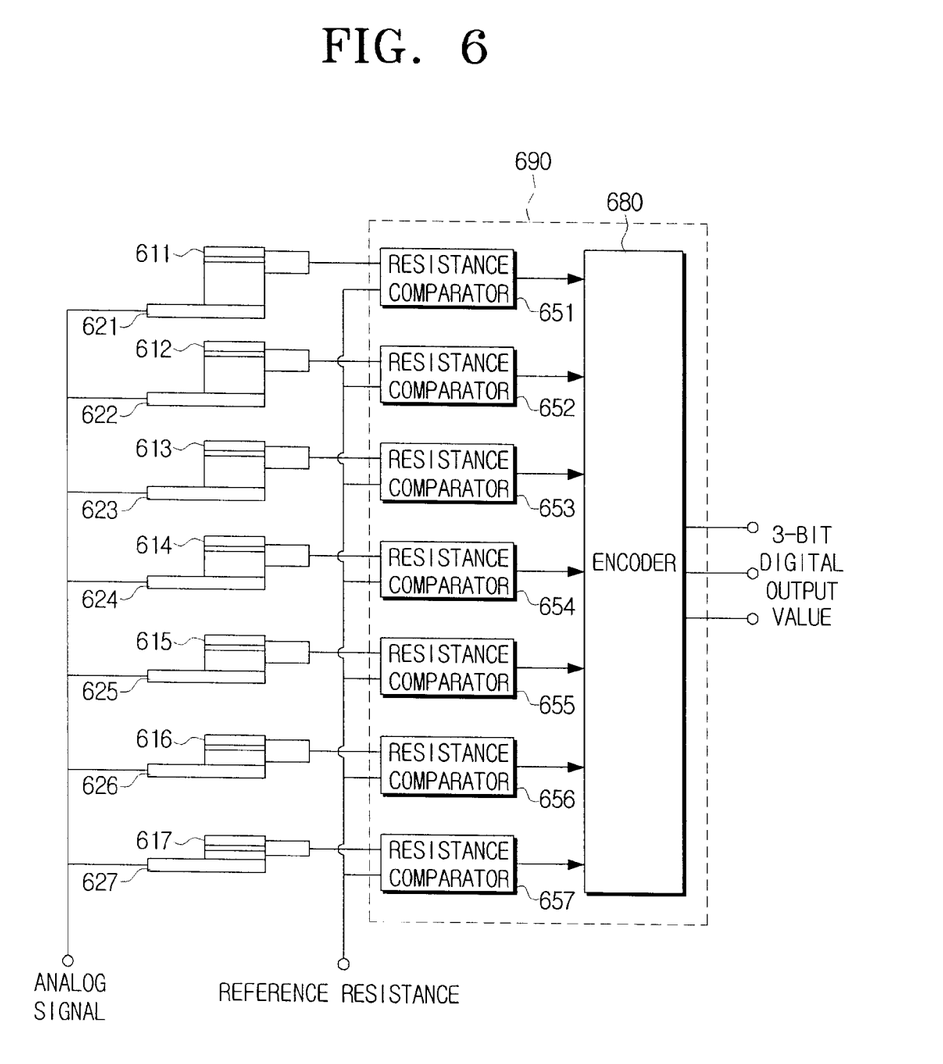
FIG. 6 is a diagram illustrating the structure of a 3-bit A/D converter having increasingly thin free layers according to another exemplary embodiment of the present invention.

As shown in FIG. 6, the 3-bit A/D converter according to another exemplary embodiment of the present invention includes seven TMR devices 611 to 617, seven electrodes 621 to 627, and a digital signal generation unit 690 wherein the digital signal generation unit 690 includes seven resistance comparators 651 to 657, and an encoder 680.

This exemplary embodiment as shown in FIG. 6 is similar to the exemplary embodiment as shown in FIG. 5, so detailed description of common elements is omitted here.

The thickness of the free layers of the TMR devices 611 to 617 decreases from the highest bit to the lowest bit. The thinner the electrode, the shorter the distance d between the electrode and the free layer. Accordingly, although the same level of voltage is applied to the electrodes 521 to 527, the intensity of the magnetic field of a lower bit applied to the free layer is stronger than that of a higher bit applied to the free layer. Consequently, the TMR devices 611 to 617 sequentially change from a parallel state to an anti-parallel state from the lowest bit. Therefore, the resistance comparators 651 to 657 sequentially output signals having a thermometer code value of 1 from the lowest bit.

As the analog signal value increases, there are more TMR devices changing to an anti-parallel state and thus the number of resistance comparators outputting a signal having a thermometer code value of 1 is higher. That is, as the analog signal value increases, the thermometer code value also increases, so the analog signal can be converted into a digital signal.

As described above, a 3-bit A/D converter can be implemented by adjusting the thickness of the free layers of the TMR devices 611 to 617.

Figure 7:
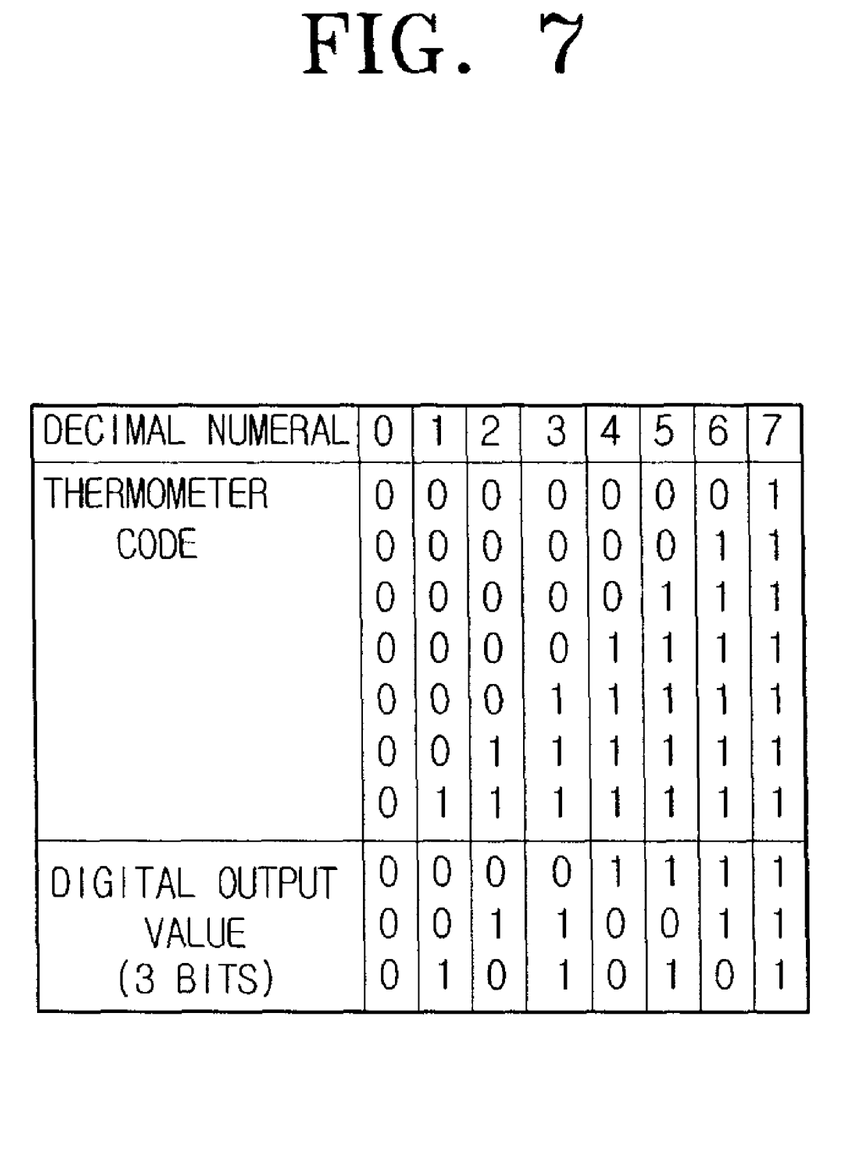
FIG. 7 is a table wherein thermometer code values and digital output values are arranged according to an exemplary embodiment of the present invention.

FIG. 7 is a table wherein thermometer code values and digital output values are arranged according to an exemplary embodiment of the present invention. The A/D converter as shown in FIGS. 5 and 6 outputs a thermometer code from the resistance comparators. Subsequently, the encoder converts the thermometer code into a digital output value. Such digital output values are shown in FIG. 7.

For example, if the fourth to seventh TMR devices 614 to 617 in FIG. 6 are changed to an anti-parallel state, the thermometer code output from the resistance comparators 651 to 657 is 0001111. Subsequently, with reference to FIG. 7, the encoder 680 converts the thermometer code 0001111 into a binary code 100. Consequently, the 3-bit digital output value is 100.

In this exemplary embodiment, a 3-bit A/D converter is described, but instead an A/D converter having a number of bits other than 3 can also be implemented. In order to implement an A/D converter of n bits, a $2^n-1$ number of TMR devices, electrodes, and resistance comparators respectively are needed.

Figure 8:
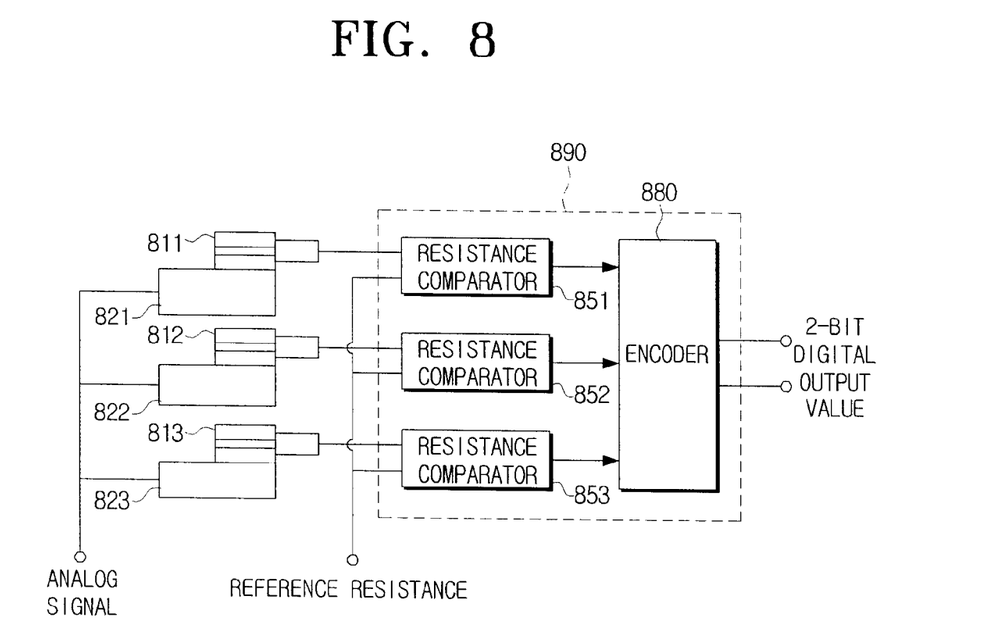
FIG. 8 is a diagram illustrating the structure of a 2-bit A/D converter according to yet another exemplary embodiment of the present invention.

A 2-bit A/D converter is described below. FIG. 8 is a diagram illustrating the structure of a 2-bit A/D converter according to yet another exemplary embodiment of the present invention.

In FIG. 8, the 2-bit A/D converter includes three TMR devices 811 to 813, three electrodes 821 to 823, three resistance comparators 851 to 853, and an encoder.

The thickness of the electrodes 821 to 823 decreases from the highest bit to the lowest bit, so the A/D converter can be implemented in the same manner as the A/D converter of FIG. 5.

Alternatively, in the same manner as the A/D converter of FIG. 6, the 2-bit A/D converter can be implemented by making the free layers of the TMR devices 811 to 813 increasingly thin sequentially from the highest bit.

As described in the above exemplary embodiments, the distance between free layers and electrodes can be adjusted by adjusting the thickness of free layers and electrodes, but can also be adjusted using other methods. For example, the distance between free layers and electrodes can be adjusted by inserting media having different thicknesses between the free layers and the electrodes.

As described in the above exemplary embodiments, when the TMR device is in a parallel state, the thermometer code value is 0, and when the TMR device is in an anti-parallel state, the thermometer code value is 1. However, the thermometer code values can be implemented in the reverse manner. That is, when the TMR device is in a parallel state, the thermometer code value may be 1, and when the TMR device is in an anti-parallel state, the thermometer code value may be 0.

As can be appreciated from the above description, an A/D converter designed to determine a digital output value according to the resistances of TMR devices is provided in order to have high resolution and high speed with low power consumption.

In particular, without using reference resistors and comparators, a converter of n bits can be implemented using TMR devices with MEMS structure in order to have high resolution with low power consumption.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. An analog to digital (A/D) converter comprising:
a plurality of electrodes each configured to receive an analog input signal common to the plurality of electrodes;
a plurality of tunneling magneto-resistive (TMR) devices each associated with a respective associated one of the plurality of electrodes, each TMR device having a resistance that is capable of changing based upon a magnetic field generated by a current that flows, in response to the analog input signal, through the associated one of the plurality of electrodes associated with that TMR device; and
a digital signal generation unit configured to output a digital output value according to the respective resistances of the plurality of TMR devices, the digital output value being indicative of a magnitude of the analog input signal.

2. The A/D converter of claim 1, wherein the digital signal generation unit comprises:
at least one resistance comparator each configured to compare the resistance of an associated one of the plurality of TMR devices with a reference resistance; and
an encoder configured to convert a thermometer code output from the at least one resistance comparator into a binary code.

3. The A/D converter of claim 2, further comprising a reference resistance unit configured to provide respective reference resistances to the at least one resistance comparator, wherein each resistance comparator is configured to compare the resistance of the TMR device associated with that resistance comparator with the reference resistance.

4. The A/D converter of claim 3, wherein each resistance comparator is configured to output a signal having a thermometer code value of 1 when the resistance of the TMR device associated with that resistance comparator is higher than the reference resistance, and
each resistance comparator is configured to output a signal having a thermometer code value of 0 when the resistance of the TMR device associated with that resistance comparator is lower than the reference resistance.

5. The A/D converter of claim 1, wherein the the plurality of electrodes varies in thickness, and
wherein the resistance of each of the plurality of TMR devices is determined according to the thickness of the respective associated one of the plurality of electrodes.

6. The A/D converter of claim 5, wherein respective thickness of the the plurality of electrodes increases sequentially from a lowest bit to a highest bit of the digital output value.

7. The A/D converter of claim 1, wherein each TMR device comprises a free layer having a thickness different from a thickness of the free layer of another TMR device,
wherein the magnetization direction of each free layer changes according to an external current, and
wherein the resistance of each TMR device is determined according to the thickness of its free layer.

8. The A/D converter of claim 7, wherein respective free layers of the plurality of TMR devices increases in their respective thicknesses sequentially from the lowest bit to the highest bit of the digital output value.

9. The A/D converter of claim 1, wherein the A/D converter is an n-bit converter, the A/D converter comprising $2^n-1$ number of electrodes.

10. The A/D converter of claim 1, wherein the A/D converter is an n-bit converter, the A/D converter comprising a $2^n-1$ number of TMR devices.

11. An analog to digital (A/D) converter, comprising
at least one electrode into which current flows according to an analog input signal;
at least one tunneling magneto-resistive (TMR) device which is arranged together with each electrode, and resistance of which changes according to a magnetic field generated by the current; and
a digital signal generation unit which determines a digital output value according to the resistance of the TMR device,
wherein the at least one electrode varies in respective thickness, and
wherein the resistance of each of the at least one TMR device is determined according to the thickness of a respective associated one of the at least one electrode.

12. The A/D converter of claim 11, wherein respective thickness of the at least one electrode increases sequentially from a lowest bit to a highest bit of the digital output value.

13. An analog to digital (A/D) converter, comprising
at least one electrode into which current flows according to an analog input signal;
at least one tunneling magneto-resistive (TMR) device which is arranged together with each electrode, and resistance of which changes according to a magnetic field generated by the current; and
a digital signal generation unit which determines a digital output value according to the resistance of the TMR device,
wherein each TMR device comprises a free layer, respective thickness of the at least one TMR device increasing from the lowest bit to the highest bit of the digital output value,
wherein the magnetization direction of the free layer changes according to an external current, and
wherein the resistance of the TMR device is determined according to the thickness of the free layer.

14. An analog to digital (A/D) converter, comprising
at least one electrode into which current flows according to an analog input signal;
at least one tunneling magneto-resistive (TMR) device which is arranged together with each electrode, and resistance of which changes according to a magnetic field generated by the current; and
a digital signal generation unit which determines a digital output value according to the resistance of the TMR device,
wherein the A/D converter is an n-bit converter, the A/D converter comprising a $2^n-1$ number of TMR devices.

* * * * *